United States Patent
Koch et al.

(10) Patent No.: US 7,952,356 B2
(45) Date of Patent: May 31, 2011

(54) SYSTEM AND METHOD FOR RECONSTRUCTING MULTI-SPECTRAL 3D MR IMAGES

(75) Inventors: Kevin M. Koch, Milwaukee, WI (US); Diego Hernando Arribas, Urbana, IL (US)

(73) Assignee: General Electric Company, Schenectady, NY (US)

( * ) Notice: Subject to any disclaimer, the term of this patent is extended or adjusted under 35 U.S.C. 154(b) by 198 days.

(21) Appl. No.: 12/478,605

(22) Filed: Jun. 4, 2009

(65) Prior Publication Data

US 2010/0308828 A1     Dec. 9, 2010

(51) Int. Cl.
*G01V 3/00*     (2006.01)
(52) U.S. Cl. ........................................ 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 4,899,109 A * | 2/1990 | Tropp et al. ................... | 324/320 |
| 7,800,368 B2 * | 9/2010 | Vaughan et al. ............... | 324/318 |
| 2009/0306511 A1 * | 12/2009 | Yamagata ...................... | 600/447 |
| 2010/0308827 A1 * | 12/2010 | Koch et al. .................... | 324/309 |

OTHER PUBLICATIONS

Butts et al., "Correction of Slice Profile Distortion from Metallic Devices," Proc. Intl. Soc. Mag. Reson. Med., vol. 14, p. 2380, 2006.
Butts et al., "Reduction of Blurring in View Angle Tilting MRI," Magnetic Resonance in Medicine, vol. 53, pp. 418-424, 2005, Wiley-Liss, Inc.
Edelman et al., "Gadolinium-Enhanced Off-Resonance Contrast Angiography," Magnetic Resonance in Medicine, vol. 57, pp. 475-484, 2007, Wiley-Liss, Inc.
Cunningham et al., "Positive Contrast Magnetic Resonance Imaging of Cells Labeled with Magnetic Nanoparticles," Magnetic Resonance in Medicine, vol. 53, pp. 999-1005, 2005, Wiley-Liss, Inc.

* cited by examiner

*Primary Examiner* — Brij B Shrivastav
(74) *Attorney, Agent, or Firm* — Ziolkowski Patent Solutions Group, SC

(57) ABSTRACT

An apparatus and method for reconstructing multi-spectral 3D MR images includes a magnetic resonance (MRI) apparatus that includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets, wherein each 3D MR data set is acquired using a central transmit and receive frequency set to an offset frequency value that is distinct for each 3D MR data set. The computer is also programmed to simultaneously generate a composite image and a magnetic field map based on the plurality of 3D MR data sets.

20 Claims, 4 Drawing Sheets

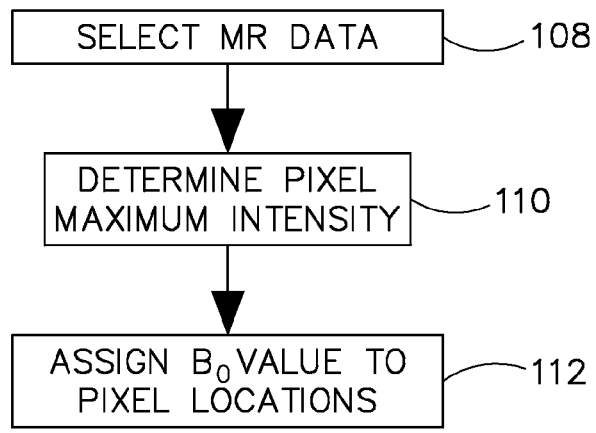
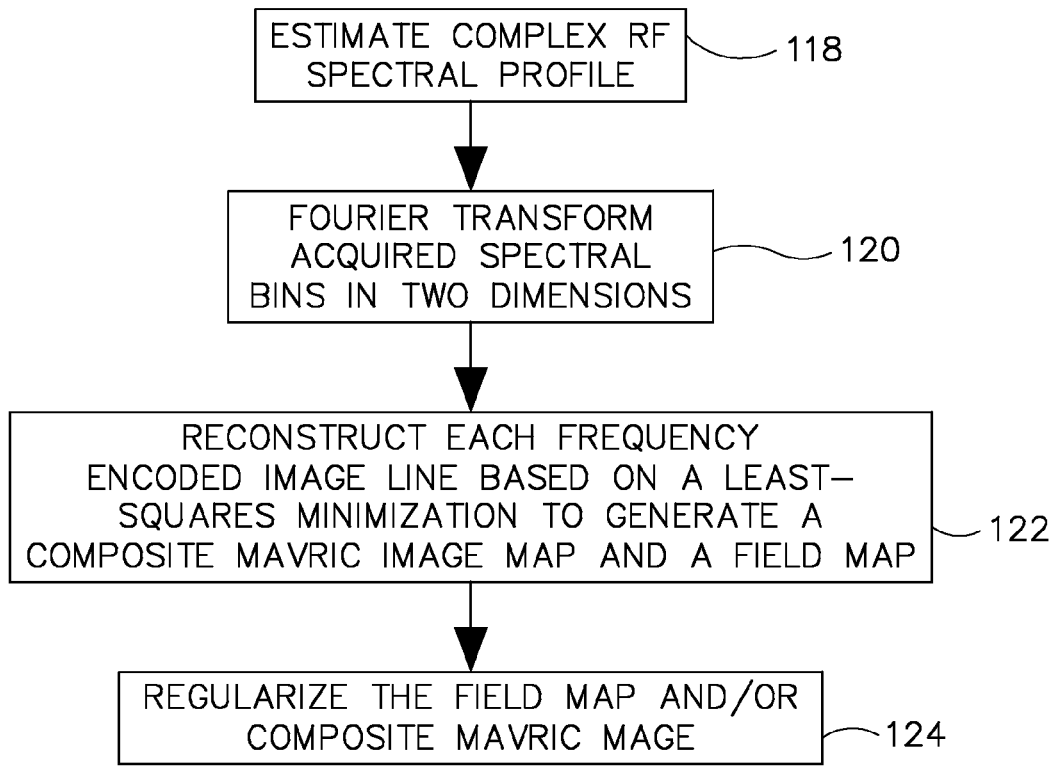

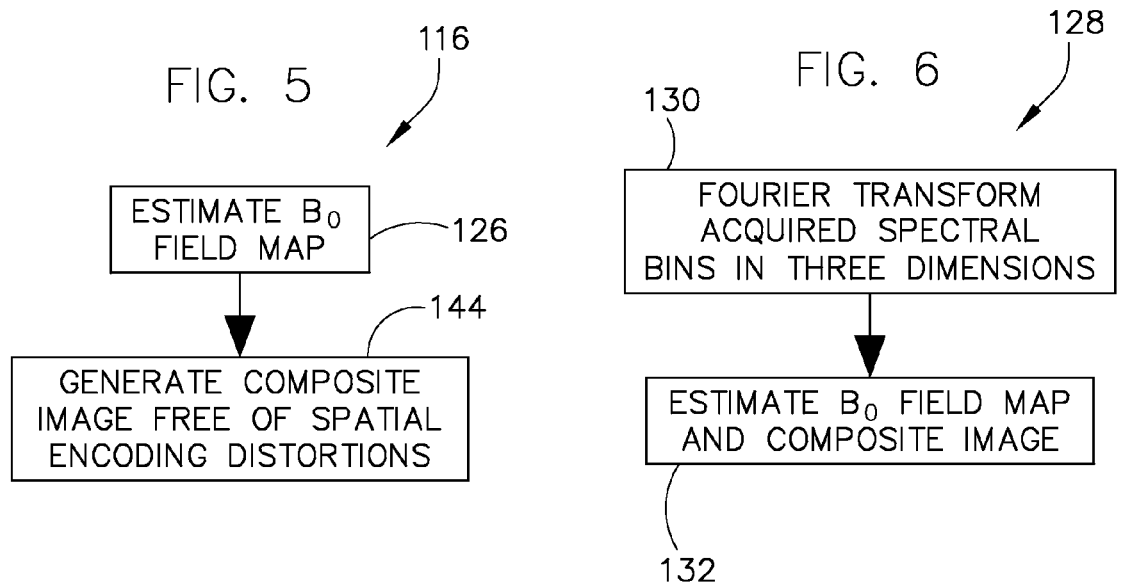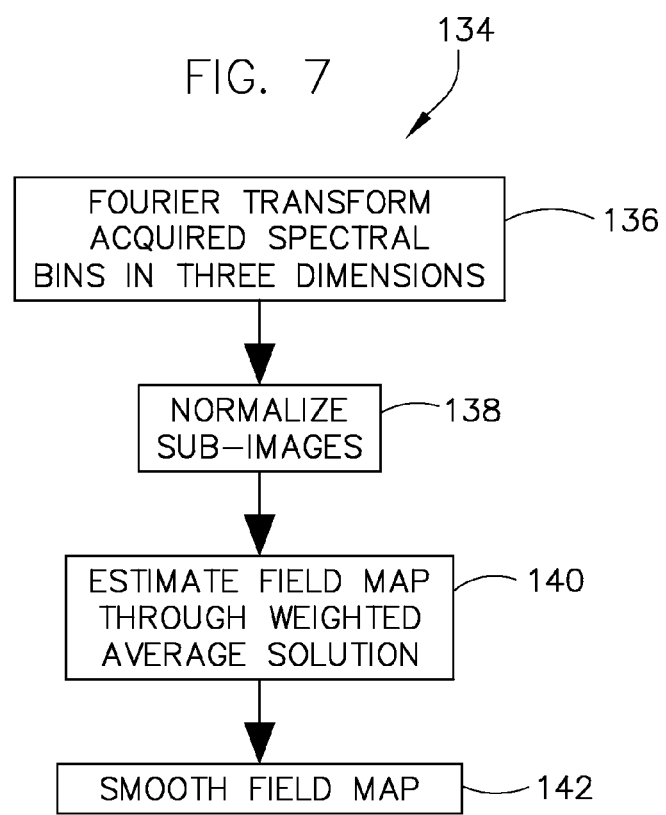

SYSTEM AND METHOD FOR RECONSTRUCTING MULTI-SPECTRAL 3D MR IMAGES

BACKGROUND OF THE INVENTION

The present invention relates generally to magnetic resonance (MR) imaging and, more particularly, MR imaging in inhomogeneous magnetic fields.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of MR in musculoskeletal (MSK) diagnostics is a rapidly growing field. Arthroplasty is the surgical placement of implants. The population of patients having some form of metal implant is quite large and growing rapidly. MR has significant capabilities in assisting the diagnosis of implant revisions. Using magnetic resonance imaging to assist in clinical diagnostics of MR-compatible arthroplastic implants, however, has proven a fundamentally challenging problem. Most materials that are robust and durable enough to utilize for bone replacements will have magnetic properties that, when placed in a typical $B_0$ magnetic field, induce extraneous fields of amplitude and spatial variation that are large compared to the field offsets utilized in conventional spatial encoding. Accordingly, these materials can introduce distortions in the main magnetic field resulting in an inhomogeneous magnetic field.

While the signal loss induced by these field gradients can largely be regained through the use of Hahn spin-echoes, the distortion they produce in both the readout and slice directions are drastic and are typically unacceptable for clinical evaluation. Despite these challenges, MRI has been shown to be quite useful in the diagnosis of degenerative conditions in arthroscopic patients. In particular, MRI has been used to screen periprosthetic soft tissues, diagnose osteolysis, and visualize implant interfaces. These diagnostic mechanisms benefit significantly from visual information near implant interfaces. Unfortunately, artifacts induced by the implants in conventional MRI images are most severe near the implant interfaces.

A proposed approach to reducing MRI artifacts induced by implants is 2D FSE imaging using View-Angle Tilting (VAT). Though this approach can improve in-plane distortions at the cost of significant image blurring, it does not address distortions in the slice-selection direction. Near the most paramagnetic of utilized metallic implants, distortions in the slice-selection direction can almost completely disfigure 2D MR images. While a slice-distortion correction of VAT images in the slice direction has been proposed, its use is limited because it does not correct signal-pileup effects of image distortion.

It would therefore be desirable to have a system and method capable of reducing image artifacts near or around implant interfaces. It would further be desirable to improve clinical diagnostic access to regions of interest near or around implant interfaces.

BRIEF DESCRIPTION OF THE INVENTION

In accordance with one aspect of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets, wherein each 3D MR data set is acquired using a central transmit and receive frequency set to an offset frequency value that is distinct for each 3D MR data set. The computer is also programmed to simultaneously generate a composite image and a magnetic field map based on the plurality of 3D MR data sets.

In accordance with another aspect of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets, wherein each 3D MR data set is acquired using a central transmit and receive frequency set to an offset frequency value that is distinct for each 3D MR data set. The computer is programmed to Fourier transform each acquired 3D MR data set into a respective sub-image and generate an estimate of a magnetic field map based on the Fourier transformed 3D MR data sets. The computer is also programmed to generate a composite image based on the estimated magnetic field map, wherein the composite image is free of spatial encoding distortions.

In accordance with another aspect of the invention, a method of magnetic resonance (MR) imaging includes determining a distinct central frequency for each of a plurality of 3D MR data acquisitions and performing the plurality of 3D MR data acquisitions, each 3D MR data acquisition having a central transmit and receive frequency set to the distinct central frequency determined therefor. The method also includes simultaneously generating a first portion of a composite image and a first portion of a magnetic field map based on the plurality of 3D MR data sets, wherein the first portion of the composite image is free of spatial encoding distortions.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 3 is a technique for constructing a magnetic field map according to an embodiment of the invention.

FIG. 4 is a technique for estimating a magnetic field map and constructing a composite MAVRIC image according to an embodiment of the invention.

FIG. 5 is a technique for constructing a composite MAVRIC image according to an embodiment of the invention.

FIG. 6 is a technique for estimating a magnetic field map for the technique shown in FIG. 5 according to an embodiment of the invention.

FIG. 7 is a technique for estimating a magnetic field map for the technique shown in FIG. 5 according to another embodiment of the invention.

DETAILED DESCRIPTION

A Multi-Acquisition Variable-Resonance Image Combination (MAVRIC) apparatus and method are provided that acquire multiple 3D MR data sets where the center transmission frequency and the center reception frequency of each 3D MR data acquisition are set to an offset frequency that is distinct for each 3D MR data set. A single image is constructed from the 3D MR data sets having reduced artifacts and reduced image distortion.

Figure 1:
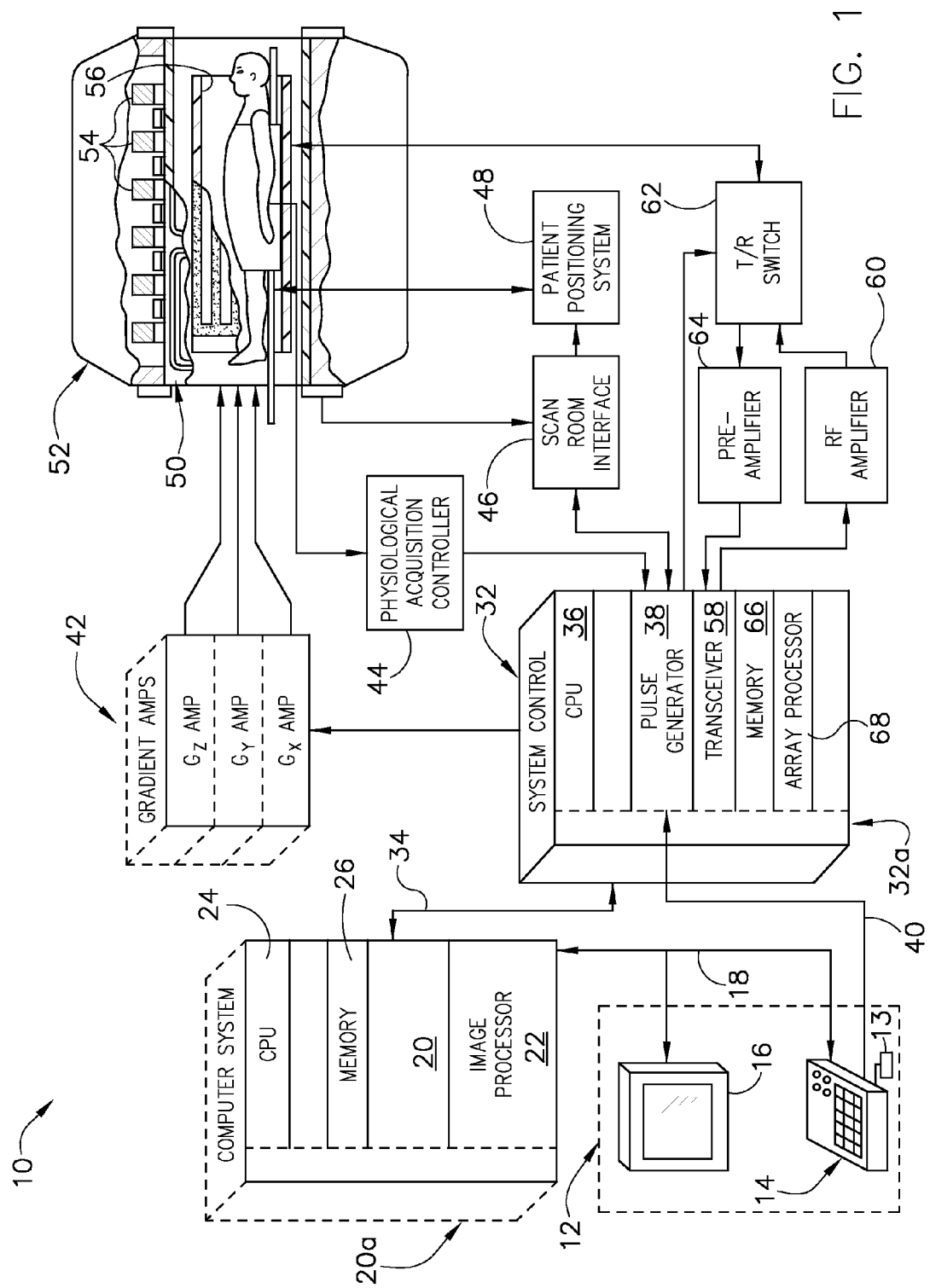
FIG. 1 is a schematic block diagram of an exemplary MR imaging system incorporating embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
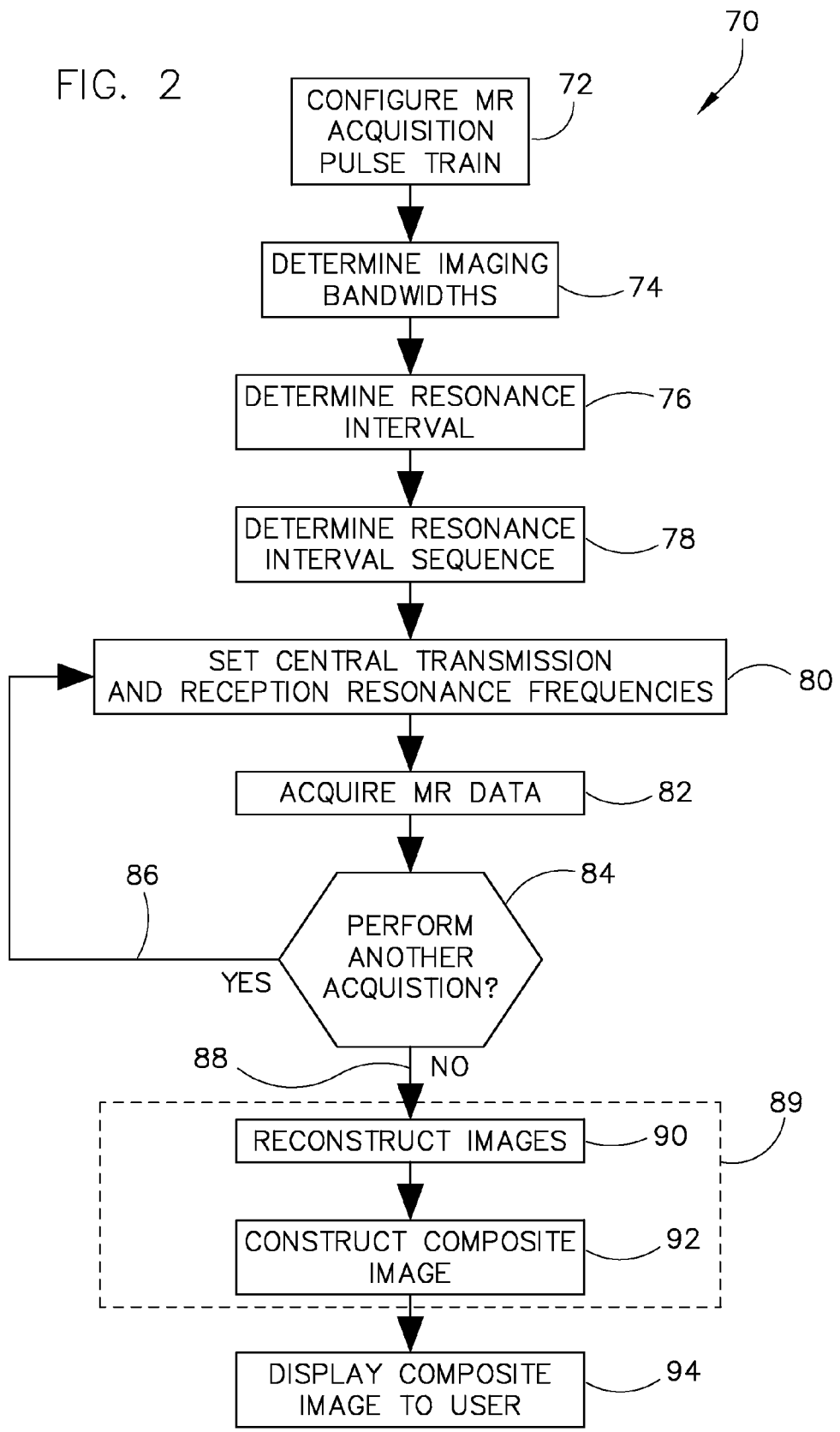
FIG. 2 is a flowchart of an MR imaging technique according to an embodiment of the invention.

FIG. 2 shows a MAVRIC technique 70 for MR imaging near or around patient metallic implants according to an embodiment of the invention. In an embodiment of the invention, technique 70 will be described with respect to 3D Fast Spin Echo (FSE) MR imaging; however, it is contemplated that technique 70 may also apply to 3D spin-echo sequences and other 3D MR acquisition techniques. In an embodiment of the invention, computer system 20 may be programmed to perform technique 70. Technique 70 begins with configuring a pulse train of an MR acquisition pulse sequence at block 72 to be used during each MR acquisition of the MR imaging to acquire a 3D MR data set. The pulse train is configured such that no slab selection imaging gradients are used. In this manner, image reconstruction may be simplified.

For a three-dimensional imaging technique applied without the use of slab selection techniques, the imaging signal obtained using a central transmission and reception frequency $v_0^{RT}$ is described as follows:

$$s(v_{0,n}^{RT}, k_x, k_y, k_z) \propto \int_{\mathbb{R}^3} \rho(x,y,z) p(\Delta v_{0,n}(x,y,z)) \times \\ e^{i2\pi \left[ k_x \left( x + \frac{\Delta v_{0,n}(x,y,z)}{2\pi \gamma G_r} \right) + k_y y + k_z z \right]} dx\,dy\,dz, \quad \text{(Eqn. 1)}$$

where $k_x$ is the readout dimension and ($k_y$, $k_z$) are the phase-encoding dimensions, $G_r$ is the amplitude of the applied readout gradient, $p(\Delta v_{0,n}(x, y, z))$ is the complex spectral profile (amplitude and phase) of the applied excitation/refocusing RF pulse sequence, and $\Delta v_{0,n}(x, y, z)$ is the frequency offset (in Hz) proportional to the static magnetic field inhomogeneity via the Larmor equation. $\Delta v_{0,n}(x, y)$ measures frequency offsets of spin isochromats precessing at frequencies $v_{off}(x, y, z)$ measured relative to a central reception and transmission frequency $v_{0,n}^{RT}$, $$\Delta v_{0,n}(x,y,z) = v_{off}(x,y,z) - v_{0,n}^{RT} \qquad \text{(Eqn. 2)}.$$

The shape of pulses of the pulse train within the MR acquisition pulse sequence is also configured. In an embodiment of the invention, a Gaussian pulse shape is used as the shape for pulses of the pulse train. In another embodiment of the invention, the pulse shape used may be based on a spatial-spectral pulse shape or on the shape of a hard or square pulse.

At block 74, imaging bandwidths for the MR acquisitions are determined. An excitation pulse bandwidth for the MR acquisition pulse sequence to be used for acquiring MR data is determined as well as a bandwidth of utilized refocusing pulses. The utilized refocusing pulse bandwidth is determined to be equal to or less than the bandwidth of the excitation pulse. Embodiments of the invention provide imaging in extreme off-resonance conditions by breaking abnormally broad spectral distributions into N discrete and independently-imaged frequency or spectral bins. This enables coverage of very large spectral ranges while simultaneously minimizing off-resonance effects in spatial encoding processes. Each MAVRIC sub-image or spectral bin, $I_n(v_{0,n}^{RT}, x, y, z)$, only impacts spins resonating within one-half the bandwidth of the applied RF pulses. Thus, the maximum effective $\Delta v_0$ offset for the entire MAVRIC image acquisition is far less than the total spectral range across the sample volume.

A receiver bandwidth for the receive coil array used to acquire MR data during the MR acquisition pulse sequence is set to a bandwidth larger than that typically used in 3D FSE imaging. In an example, the receiver bandwidth is set to ±125 kHz. Then, for a MAVRIC acquisition using 2 kHz RF pulses, if a 256 sampled readout is collected at a readout bandwidth of ±125 kHz, the maximum absolute displacement in a composite MAVRIC image is roughly 1 pixel, independent of absolute $\Delta v_0$ offsets. It is contemplated that the receiver bandwidth may also be set to a value greater than ±125 kHz. In the described MAVRIC technique herein, off-resonance readout distortion is limited to frequency offsets contained in the RF refocusing band. Setting the receiver bandwidth accordingly helps to minimize this residual readout distortion in reconstructed images.

A resonance interval is determined at block 76 that represents an offset for both the center resonance frequency for transmission and the center resonance frequency for reception between sets of acquired MR data. According to an embodiment of the invention, the resonance interval is less than the bandwidth of the utilized refocusing pulses. At block 78, a resonance interval sequence is determined for acquiring 3D MR data sets. The resonance interval sequence includes offset frequency values, or $B_0$ values, to which central transmission and central reception resonance frequencies are set during MR acquisition. In an embodiment of the invention, the resonance interval sequence includes an offset frequency value of zero. Additional values in the resonance interval sequence include multiples of the resonance interval. For example, the resonance interval sequence may include values for the central transmission and central reception resonance frequencies to be set to each 1 kHz offset step in the range −7 kHz to +7 kHz.

In an embodiment of the invention, the resonance interval sequence is set to interleave or interlace the offset frequency values such that sequential MR acquisitions based on the offset frequency values do not acquire MR data with the central transmission and central reception resonance frequencies set to sequential offset frequency values. For example, an interleaved resonance interval sequence with a 1 kHz resonance interval (or offset step) in the range −7 kHz to +7 kHz may have the following order: [−7, 1, −5, 3, −3, 5, −1, 7, −6, 0, −4, 6, −2, 4, 2 kHz]. Accordingly, neighboring values in the resonance interval sequence are separated by more than the offset step of 1 kHz. Interleaving the resonance interval sequence in this manner reduces interaction between 3D MR data acquisitions in an imaging scan. As described further below, each offset frequency value in the resonance interval sequence is used as the central transmission and reception frequency for a different 3D MR data acquisition. In one embodiment, an MR imaging scan (or protocol) may be configured such that a first set of acquisitions uses a resonance interval sequence with the offset frequency values [−7, 1, −5, 3, −3, 5, −1, 7 kHz] during a single scan and such that a second set of acquisitions uses a resonance interval sequence with the offset frequency values [−6, 0, −4, 6, −2, 4, 2 kHz] during another single scan. The resonance interval sequence values listed above are illustrative only and do not limit the invention. Other and different orders and values for the resonance interval sequence values are considered and are within the scope of the invention.

At block 80, the central transmission and central reception resonance frequencies for a 3D MR data acquisition are both set to one of the values in the resonance interval sequence, in particular, the central transmission frequency and the central reception frequency for the acquisition are set to the same offset frequency value. 3D MR data is acquired at block 82 using the scan parameters and sequences configured and determined in the previous steps of technique 70. In an embodiment of the invention, the 3D MR data is acquired using non-parallel imaging techniques. The 3D MR data may be acquired via multi-channel RF coil 56 of FIG. 1 or via another multi-channel receive coil. However, it is contemplated that parallel imaging techniques such as ARC, and the like may also be used and that multiple multi-channel receive coils may be used to acquire the 3D MR data. At block 84, it is determined if another 3D MR data acquisition should be performed. If all the offset frequency values in the resonance interval sequence have not been used 86, then process control returns to block 80 for setting the central transmission and central reception resonance frequencies for the next 3D MR data acquisition to another of the offset frequency values in the resonance interval sequence and at block 82 3D MR data for another 3D MR data set is acquired as described above. If all the offset frequency values in the resonance interval sequence have been used 88, image reconstruction 89 may then begin.

In an embodiment of the invention, an image is reconstructed at block 90 for each MR data set acquired, resulting in a collection of images. In this embodiment, the acquired MAVRIC signal for each $n^{th}$ spectral bin, $S_n(v_{0,n}^{RT}, kx, ky, kz)$, is Fourier transformed to obtain sub-images $I_n(v_{0,n}^{RT}, x, y, z)$, which will possess visually recognizable artifacts only at those locations where the $B_0$ field changes sufficiently fast along the readout dimension. Specifically, such artifacts are most prevalent when the local $B_0$ field gradients are of magnitude at or beyond the magnitude of the readout encoding gradient.

A final, single composite MAVRIC image is then constructed at block 92. In an embodiment of the invention, the composite image is constructed using the maximum intensity projection (MIP) of each pixel from the collection of images. A pre-determined pixel location in each image of the collection of images is used to determine which image contains the greatest intensity projection for the pre-determined pixel location. The greatest intensity projection value is then used for the same location in the final composite image.

In another embodiment, the final, single composite MAVRIC image may be constructed using iterative reconstruction based on a magnetic field map. MAVRIC data includes spectral information that can be used to generate $B_0$ field maps. FIG. 3 shows a technique 106 for constructing a magnetic field map according to an embodiment of the invention. At block 108, a plurality of reconstructed MR images are selected. In one embodiment, the plurality of reconstructed MR images are retrieved from an image storage location such as memory 26 shown in FIG. 1 or another computer readable storage medium. The plurality of reconstructed images may be generated using the technique described above with respect to FIG. 2. In another embodiment, the plurality of reconstructed MR images may be generated on-the-fly. For example, the plurality of MR images may be generated using the technique described above with respect to FIG. 2. At block 110, the pixels for each of the plurality of MR images are examined to determine, for each pixel location, which image of the plurality of MR images has the maximum intensity. At block 112, each pixel location in the magnetic field map is assigned the offset frequency value, or $B_0$ value, to which the central transmission and central reception resonance frequencies are set to in the image determined to have the maximum intensity for the corresponding pixel location. For example, for a given magnetic field map pixel location, the image acquired with the central transmission and central reception resonance frequencies set to 3 kHz may have the maximum intensity for the corresponding pixel location. Accordingly, the value of 3 kHz is used for the given magnetic field map pixel location. For an adjacent magnetic field map pixel location, it may be determined that the image acquired with the central transmission and central reception resonance frequencies set to −4 kHz may have the maximum intensity for the corresponding pixel location. Accordingly, the value of −4 kHz is used for the adjacent magnetic field map pixel location.

Returning to FIG. 2, in another embodiment, the composite image may be constructed using a sum-of-squares method where the MR data sets are acquired using Gaussian-shaped pulses. For example, the composite image may be given by a quadrature combination of the sub images, $I_n(v_{0,n}^{RT}, x, y, z)$, $$I_{MAV}(x, y, z) = \sqrt{\sum_{n=1}^{N} (I_n(v_{0,n}^{RT}, x, y, z))^2} . \quad \text{(Eqn. 3)}$$

At block 94, the composite image may be displayed to a user via a display such as display 16 of FIG. 1.

One skilled in the art will recognize that the steps of technique 70 may be performed in another order than that described and that such is within the scope of embodiments of the invention.

FIGS. 4 and 5 show techniques 114, 116, respectively, for composite MAVRIC image reconstruction for image reconstruction block 89 of FIG. 2 according to embodiments of the invention. Techniques 114, 116 allow for composite MAVRIC image reconstruction even when imaging in the presence of significant spatial $B_0$ variations.

Technique 114 of FIG. 4 allows for simultaneous and combined or joint estimation of a composite MAVRIC image and of a magnetic field map (i.e., full 3D spectral sub-images are not reconstructed independently as set forth in technique 70). For technique 114, no assumptions or approximations of the data structure are needed. However, reasonably accurate estimates of a complex RF spectral profile $p(\Delta v_{0,n}(x, y, z))$ are used. Accordingly, technique 114 begins at block 118 by estimating the complex RF spectral profile $p(\Delta v_{0,n}(x, y, z))$. In one embodiment, reasonable estimates of this profile can be gained from typical RF pulse design algorithms such as a Shinnar-Le Roux (SLR) pulse-design algorithm. In other embodiments, models may also be gained through Bloch equation solution of applied RF pulse trains that may be more accurate.

Technique 114 then proceeds to block 120 in which each acquired MAVRIC signal spectral bin $S_n(v_{0,n}^{RT}, k_x, k_y, k_z)$ is Fourier transformed the along the y and z dimensions. The y and z dimensions are phase-encoded and, therefore, are free of $B_0$-related distortions. A hybrid data set or mixed-domain signal $\bar{s}$ is obtained from the two-dimensional Fourier transform and is given by:

$$\bar{s}_{v_{0,n}^{RT}}(k_x, y, z) \propto \int_{\mathbb{R}} \rho(x, y, z) p(\Delta v_{0,n}(x, y, z)) \times \quad \text{(Eqn. 4)}$$
$$e^{i 2\pi k_x \left(x + \frac{\Delta v_{0,n}(x,y,z)}{2\pi \gamma G_r}\right)} dx,$$

where $\Delta v_{0,n}(x, y, z) = v_{off}(x, y, z) - v_{0,n}^{RT}$ (see Eqn. 2), where $\gamma$ is the gyromagentic ratio of the imaged nuclei, and where $G_r$ is the readout (frequency encoding) gradient strength.

The signal model in Eqn. 4 contains two unknowns: the image $\rho(x, y, z)$ and the field map $v_{off}(x, y, z)$, which appears implicitly in $\Delta v_{0,n}(x, y, z)$. Under an assumption of white Gaussian noise, a maximum likelihood (ML) estimate for the two unknowns corresponds to a least-squares (LS) fit.

As shown in Eqn. 4, $B_0$ distortions appear only along the readout (x) direction. Thus, each frequency encoded image line, for a fixed (y,z) location, is reconstructed at block 122 independently in the ML sense, which corresponds to minimizing the least-squares (LS) cost function $L(v_{off}, \rho)$, defined as:

$$L(v_{off}, \rho) = \|\bar{s} - A(v_{off})\rho\|^2 \quad \text{(Eqn. 5)},$$

where the data vector $\bar{s}$ contains the data corresponding to all spectral sub-bands for the current image line, the vector $\rho$ contains the desired frequency encoded image line, the notation $\|\cdot\|$ represents the 2-norm of a vector, and the system matrix $A(v_{off})$, which depends nonlinearly on the field map $v_{off}$, performs the discretized mapping shown in Eqn. 4. Accordingly, the composite MAVRIC image $\rho(x, y, z)$ and the field map $v_{off}(x, y, z)$ are generated at block 122.

At block 124, regularization of the field map and/or image may be performed by introducing the corresponding penalty term $\Psi(v_{off}, \rho)$, for example, in the cost function, and thus minimizing:

$$L_{reg}(v_{off}, \rho) = \|\bar{s} - A(v_{off})\rho\|^2 + \Psi(v_{off}, \rho) \quad \text{(Eqn. 6)},$$

where $\Psi(v_{off}, \rho)$ penalizes, for example, roughness in the field map or the image. In one embodiment, quadratic penalties of the form $\Psi(v_{off}, \rho) = \|D_1 v_{off}\|^2 + \|D_2 \rho\|^2$ are used.

Other quadratic penalties known in the art may also be used according to an embodiment of the invention. For quadratic penalties, minimization of $L_{reg}(v_{off}, \rho)$ is a nonlinear least-squares (NLLS) situation and can be solved using standard algorithms. For example, a trust-region method using an approximated Gauss-Newton direction may be used to solve the minimization of $L_{reg}(v_{off},\rho)$.

While the joint estimation approach of technique 114 provides optimal reconstruction in the ML sense, it includes the solution of a relatively large, non-convex optimization problem at each image line. This can be substituted by a more efficient decoupled estimation method described below in FIGS. 5-7, where the field map is first estimated from the original (distorted) reconstruction, and this field map is then used for distortion correction of the data.

Technique 116 of FIG. 5 allows for a decoupled estimation of the $B_0$ field map and composite MAVRIC image. Technique 116 begins at block 126 by estimating the $B_0$ field map.

In one embodiment, the field map estimation of block 126 may be estimated via a technique 128 shown in FIG. 6. Technique 128 begins at block 130 by Fourier transforming each $n^{th}$ spectral bin, $S_n(v_{0,n}^{RT}, kx, ky, kz)$, in three dimensions to obtain sub-images $I_n(v_{0,n}^{RT}, x, y, z)$. Next, a $B_0$ field map and a composite MAVRIC image are estimated from the sub-images at block 132. The estimated composite MAVRIC image is a nuisance parameter in technique 128 and is not used for the final composite MAVRIC image generation. In locations where the $B_0$ field of the sub-images approaches central frequencies $v_{0,n}^{RT}$, the amplitude of image $I_n$ will be large compared to the amplitudes of the remaining images. Specifically, assuming the spectral profile $p(\Delta v_{0,n}(x, y, z))$ is known, solution of the NLLS problem:

$$[I_{MAV}^*, v_{off}^*] = \arg\min_{I_{MAV}, v_{off}} \sum_{n=1}^{N} |I_n - I_{MAV} p(\Delta v_{0,n}(x, y, z))|^2 \quad \text{(Eqn. 7)}$$

is used and executed to generate the estimate of the $B_0$ field map, $v_{off}(x, y, z)$, and of the composite image, $I_{MAV}(x, y, z)$, independently at each spatial location under the assumption of white Gaussian noise, where $\Delta v_{0,n}(x, y, z) = v_{off}(x, y, z) - v_{0,n}^{RT}$.

In another embodiment of the invention, the field map estimation of block 126 of technique 116 may be performed via a technique 134 shown in FIG. 7. Technique 134 begins at block 136 by Fourier transforming each $n^{th}$ spectral bin, $s_n(v_{0,n}^{RT}, kx, ky, kz)$, in three dimensions to obtain sub-images $I_n(v_{0,n}^{RT}, x, y, z)$. At block 138, sub-images $I_n$ are normalized using the following equation:

$$\sum_{n=1}^{N} I_n(v_{0,n}^{RT}, x, y, z) = 1 \forall x, y, z. \quad \text{(Eqn. 8)}$$

Given normalized MAVRIC sub-image magnitudes, a weighted average field map solution is estimated at block 140 as:

$$v_{off}^*(x, y, z) = \sum_{n=1}^{N} I_n(v_{0,n}^{RT}, x, y, z) \cdot v_{0,n}^{RT}. \quad \text{(Eqn. 9)}$$

The use of appropriate spectral windowing helps improve the accuracy of the weighted average approach using Eqn. 9. Overlapping Gaussian windows may be used for this spectral windowing. Slight deviations from Gaussian profiles may also be utilized for this spectral windowing with varying degrees of field map estimation accuracy.

Because voxel-by-voxel estimated field maps are accurate in regions of high signal but are very rough in noisy regions, $B_0$ distortion correction may be complicated thereby. Accordingly, at block 142, the field map estimated at block 140 is smoothed using a weighted $L_2$ approach, where smoothness is imposed by penalizing second-order finite differences, and where weights are assigned proportional to the signal magnitude at each location to preserve the estimates in high-signal regions, while ignoring those arising from noisy regions.

Referring back to FIG. 5, once the field map is estimated at block 126, a composite MAVRIC image free of spatial encoding distortions is generated at block 144 by considering the signal model in Eqn. 4.

If the spectral profile p is known accurately, the composite MAVRIC image, $\rho(x, y, z)$, can be directly estimated from the acquired data $s_n(v_{0,n}^{RT}, kx, ky, kz)$ by minimizing Eqn. 6, where the field map is now fixed. Specifically, this amounts to minimizing:

$$L_{reg}(\rho) = \|\bar{s} - A\rho\|^2 + \|D\rho\|^2 \quad \text{(Eqn. 10)},$$

where the system matrix A accounts for the estimated field map $v^*_{off}$, which may be obtained a priori using techniques described above, where D is a regularization parameter that may be "tuned" once for a given reconstruction strategy, and where $\bar{s}$ corresponds to Eqn. 6 substituting $v^*_{off}$ for $v_{off}$. This minimization results in a linear LS problem and has the closed form solution:

$$\hat{\rho} = (A^H A + D^H D)^{-1} A^H \bar{s} \quad \text{(Eqn. 11)},$$

where H denotes Hermitian transpose and $\hat{\rho}$ denotes the final composite MAVRIC image. Note that the matrix $(A^H A + \lambda D^H D)$ is guaranteed to be invertible if D has full column rank. The inversion can be performed very rapidly with a variety of methods due to the small size (e.g., 256×256) of the matrix.

Alternatively, if the spectral profile p is not known accurately, each individual image $I_n(v_{0,n}^{RT}, x, y, z)$ can be generated using Eqn. 10, where $\rho$ represents each individual image. A final composite MAVRIC image can be subsequently obtained using quadrature combination (see Eqn. 3) of these individual images.

Because technique 116 is faster than technique 114 and provides accurate field map estimates everywhere except for regions of very rapid field variation, the field map estimated by technique 116 may be used as an initial guess for initialization of technique 114. Note that technique 114 reduces to a non-convex optimization problem (e.g., NLLS). Thus, employing a good initial field map guess in technique 114 will have not only reduce computations, but it will also affect the final estimate provided thereby.

Technique 114 also produces different results compared with technique 116. However, the difference is negligible everywhere except for those locations where the $B_0$ field varies extremely rapidly (e.g., over 1 kHz/pixel). Thus, the faster technique 116 may be used for all those image lines that do not contain such fast variations. For the remaining image lines, technique 114 may be used. Lines to which technique 114 may be used in this manner may be detected using a threshold on the estimated field map produced by technique 116.

Furthermore, even within image lines containing rapid field variations, these are typically confined to a small set of voxels. This allows correction of the values of the field map for most of the voxels to the results produced by technique 116, while technique 114 may be used to obtain estimates for the small set of voxels (those at or near locations of high inhomogeneity) within each line.

Additionally, since techniques 114 and 116 are performed independently for each image line, parallel computing methods (where each line is reconstructed on a different CPU) may be used to accelerate generation of the field map and final composite MAVRIC image.

Embodiments of the invention allow for improved MR imaging near or around metallic implants such that artifacts and image distortion are reduced. Further, embodiments of the invention are applicable in MR imaging where significant heterogeneity of the $B_0$ magnetic field exists.

A technical contribution for the disclosed method and apparatus is that is provides for a computer implemented method for MR imaging in inhomogeneous magnetic fields.

In accordance with one embodiment of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets, wherein each 3D MR data set is acquired using a central transmit and receive frequency set to an offset frequency value that is distinct for each 3D MR data set. The computer is also programmed to simultaneously generate a composite image and a magnetic field map based on the plurality of 3D MR data sets.

In accordance with another embodiment of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets, wherein each 3D MR data set is acquired using a central transmit and receive frequency set to an offset frequency value that is distinct for each 3D MR data set. The computer is programmed to Fourier transform each acquired 3D MR data set into a respective sub-image and generate an estimate of a magnetic field map based on the Fourier transformed 3D MR data sets. The computer is also programmed to generate a composite image based on the estimated magnetic field map, wherein the composite image is free of spatial encoding distortions.

In accordance with another embodiment of the invention, a method of magnetic resonance (MR) imaging includes determining a distinct central frequency for each of a plurality of 3D MR data acquisitions and performing the plurality of 3D MR data acquisitions, each 3D MR data acquisition having a central transmit and receive frequency set to the distinct central frequency determined therefor. The method also includes simultaneously generating a first portion of a composite image and a first portion of a magnetic field map based on the plurality of 3D MR data sets, wherein the first portion of the composite image is free of spatial encoding distortions.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MRI) apparatus comprising:
an MRI system having a plurality of gradient coils positioned about a bore of a magnet, and an RF transceiver system and an RF switch controlled by a pulse module to transmit RF signals to an RF coil assembly to acquire MR images; and
non-transitory computer readable medium have stored thereon a program that causes a computer to:
acquire a plurality of three-dimensional (3D) MR data sets, $S_n(v_{0,n}^{RT}, kx, ky, kz)$, wherein each 3D MR data set is acquired using a central transmit and receive frequency, $v_0^{RT}$, set to an offset frequency value that is distinct for each 3D MR data set, and where kx is a readout dimension, and where ky and kz are phase-encoding dimensions; and
simultaneously generate a composite image and a magnetic field map based on the plurality of 3D MR data sets.

2. The MRI apparatus of claim 1 wherein the computer is further programmed to acquire each of the plurality of 3D MR data sets without slab selection via imaging gradients.

3. The MRI apparatus of claim 1 wherein the computer is further programmed to estimate an RF spectral profile $p(\Delta v_{0,n}(x, y, z))$, where $\Delta v_{0,n}(x, y, z)$ is a frequency offset in Hz and is proportional to a static magnetic field inhomogeneity.

4. The MRI apparatus of claim 3 wherein the computer is programmed to estimate the RF spectral profile via one of a Shinnar-Le Roux pulse-design algorithm and a Bloch equation solution of applied RF pulse trains.

5. The MRI apparatus of claim 3 wherein the computer is further programmed to Fourier transform each 3D MR data set, $S_n(v_{0,n}^{RT}, kx, ky, kz)$, along the ky and kz phase-encoding dimensions into a hybrid data set S given by:

$$\bar{s}_{v_{0,n}^{RT}}(k_x, y, z) \propto \int_\mathbb{R} \rho(x, y, z) p(\Delta v_{0,n}(x, y, z)) \times e^{i2\pi k_x \left(x + \frac{\Delta v_{0,n}(x,y,z)}{2\pi \gamma G_r}\right)} dx,$$

where $\Delta v_{0,n}(x, y, z) = v_{off}(x, y, z) - v_{0,n}^{RT}$, where the composite image is represented by $\rho(x, y, z)$, where the field map is represented by $v_{off}(x, y, z)$, where $\gamma$ is a gyromagentic ratio of imaged nuclei, and where $G_r$ is a readout gradient strength.

6. The MRI apparatus of claim 5 wherein simultaneously generating the composite image and the magnetic field map comprises independently reconstructing frequency encoded image lines using a maximum likelihood estimate corresponding to:

$$L(v_{off}, \rho) = \|\bar{s} - A(v_{off})\rho\|^2,$$

where the data vector $\bar{s}$ contains the data corresponding to all spectral sub-bands for a current image line, the vector $\rho$ contains the frequency encoded image line, the notation $\|\cdot\|$ represents the 2-norm of a vector, and the system matrix $A(v_{off})$, which depends nonlinearly on the field map $v_{off}$, performs discretized mapping.

7. The MRI apparatus of claim 6 wherein the computer is further programmed to regularize one of the composite image and the field map via a minimization of:

$$L_{reg}(v_{off}, \rho) = \|\bar{s} - A(v_{off})\rho\|^2 + \Psi(v_{off}, \rho),$$

where $\Psi(v_{off}, \rho)$ corresponds to a penalty term configured to penalize a parameter of the one of the composite image and the field map.

8. The MRI apparatus of claim 7 wherein the parameter is a roughness of the one of the composite image and the field map.

9. A magnetic resonance (MRI) apparatus comprising:
an MRI system having a plurality of gradient coils positioned about a bore of a magnet, and an RF transceiver system and an RF switch controlled by a pulse module to transmit RF signals to an RF coil assembly to acquire MR images; and non-transitory computer readable medium have stored thereon a program that causes a computer to:

acquire a plurality of three-dimensional (3D) MR data sets, $S_n(v_{0,n}^{RT}, kx, ky, kz)$, wherein each 3D MR data set is acquired using a central transmit and receive frequency, $v_0^{RT}$, set to an offset frequency value that is distinct for each 3D MR data set, and where kx is a readout dimension, and where ky and kz are phase-encoding dimensions;

Fourier transform each acquired 3D MR data set into a respective sub-image, $I_n(v_{0,n}^{RT}, x, y, z)$;

generate an estimate, $v^*$, of a magnetic field map, $v_{off}(x, y, z)$, based on the Fourier transformed 3D MR data sets;

generate a composite image, $I_{MAV}(x, y, z)$, based on the estimated magnetic field map, wherein the composite image is free of spatial encoding distortions.

10. The MRI apparatus of claim 9 wherein the computer is further programmed to generate an estimate, $I^*_{MAV}$, of the composite image.

11. The MRI apparatus of claim 10 wherein the computer is further programmed to generate the estimates of the magnetic field map and the composite image independently at each spatial location using the equation:

$$[I^*_{MAV}, v^*] = \mathrm{argmin}_{I_{MAV}, v} \sum_{n=1}^{N} |I_n - I_{MAV} p(\Delta v_{0,n}(x, y, z))|^2,$$

where $p(\Delta v_{0,n}(x, y, z))$ corresponds to a spectral profile, and where $\Delta v_{0,n}(x, y, z) = v(x, y, z) - v_{0,n}^{RT}$.

12. The MRI apparatus of claim 11 wherein the computer is programmed to generate the composite image by minimizing:

$$L_{reg}(\rho) = \|\bar{s} - A\rho\|^2 + \|D\rho\|^2,$$

where:
A is a matrix accounting for the field map $v^*_{off}$;
$\rho$ represents the composite image;
the notation $\|\cdot\|$ represents the 2-norm of a vector;
D is a regularization parameter;
$\bar{s}$ is a hybrid data set given by:

$$\bar{s}_{v_{0,n}^{RT}}(k_x, y, z) \propto \int_{\mathbb{R}} \rho(x, y, z) p(\Delta v_{0,n}(x, y, z)) \times e^{i2\pi k_x \left(x + \frac{\Delta v_{0,n}(x,y,z)}{2\pi\gamma G_r}\right)} dx,$$

where $\Delta v_{0,n}(x, y, z) = v^*_{off}(x, y, z) - v_{0,n}^{RT}$, where $\gamma$ is a gyromagnetic ratio of imaged nuclei, and where $G_r$ is a readout gradient strength.

13. The MRI apparatus of claim 9 wherein the computer is further programmed to normalize the respective sub-images according to:

$$\sum_{n=1}^{N} I_n(v_{0,n}^{RT}, x, y, z) = 1 \forall x, y, z.$$

14. The MRI apparatus of claim 13 wherein the computer is programmed to generate the estimate, $v^*$, via a weighted average solution given by:

$$v^*_{off}(x, y, z) = \sum_{n=1}^{N} I_n(v_{0,n}^{RT}, x, y, z) \cdot v_{0,n}^{RT}.$$

15. The MRI apparatus of claim 14 wherein the computer is further programmed to smooth the estimated field map.

16. The MRI apparatus of claim 14 wherein the computer is programmed to generate the composite image by minimizing:

$$L_{reg}(\rho) = \|\bar{s} - A\rho\|^2 + \|D\rho\|^2,$$

where:
A is a matrix accounting for the field map $v^*_{off}$;
$\rho$ represents the composite image;
the notation $\|\cdot\|$ represents the 2-norm of a vector;
D is a regularization parameter;
$\bar{s}$ is a hybrid data set given by:

$$\bar{s}_{v_{0,n}^{RT}}(k_x, y, z) \propto \int_{\mathbb{R}} \rho(x, y, z) p(\Delta v_{0,n}(x, y, z)) \times e^{i2\pi k_x \left(x + \frac{\Delta v_{0,n}(x,y,z)}{2\pi\gamma G_r}\right)} dx,$$

where $\Delta v_{0,n}(x, y, z) = v^*_{off}(x, y, z) - v_{0,n}^{RT}$, where $\gamma$ is a gyromagnetic ratio of imaged nuclei, and where $G_r$ is a readout gradient strength.

17. A method of magnetic resonance (MR) imaging comprising:

determining a distinct central frequency for each of a plurality of 3D MR data acquisitions, $S_n(v_{0,n}^{RT}, kx, ky, kz)$, where kx is a readout dimension, and where ky and kz are phase-encoding dimensions;

performing the plurality of 3D MR data acquisitions, each 3D MR data acquisition having a central transmit and receive frequency, $v_0^{RT}$, set to the distinct central frequency determined therefor; and simultaneously generating a first portion of a composite image and a first portion of a magnetic field map, $v_{off}(x, y, z)$, based on the plurality of 3D MR data sets, wherein the first portion of the composite image is free of spatial encoding distortions.

18. The method of claim 17 further comprising:

applying a Fourier transform to each acquired 3D MR data acquisition to obtain a respective sub-image, $I_n(v_{0,n}^{RT}, x, y, z)$;

generating an estimate, $v^*$, of a second portion of the magnetic field map based on the Fourier transformed 3D MR data acquisitions;

generating a second portion of the composite image based on the estimated second portion of the magnetic field map, wherein the second portion of the composite image is free of spatial encoding distortions.

19. The method of claim 18 wherein performing the plurality of 3D MR data acquisitions comprises performing the plurality of 3D MR data acquisitions without slab selection using imaging gradients.

20. The method of claim 19 further comprising displaying the first and second portions of the composite image to a user.

* * * * *

UNITED STATES PATENT AND TRADEMARK OFFICE
CERTIFICATE OF CORRECTION

| | | |
|---|---|---|
| PATENT NO. | : 7,952,356 B2 | |
| APPLICATION NO. | : 12/478605 | |
| DATED | : May 31, 2011 | |
| INVENTOR(S) | : Koch et al. | |

It is certified that error appears in the above-identified patent and that said Letters Patent is hereby corrected as shown below:

Col. 12, line 30 (Claim 5), delete "S given by:" and substitute therefore -- $\bar{S}$ given by: --.

Signed and Sealed this
Sixteenth Day of August, 2011

David J. Kappos
*Director of the United States Patent and Trademark Office*